US006861867B2

(12) United States Patent
West et al.

(10) Patent No.: US 6,861,867 B2
(45) Date of Patent: Mar. 1, 2005

(54) METHOD AND APPARATUS FOR BUILT-IN SELF-TEST OF LOGIC CIRCUITS WITH MULTIPLE CLOCK DOMAINS

(75) Inventors: Eric West, San Jose, CA (US); Shridhar Mukund, San Jose, CA (US)

(73) Assignee: Lightspeed Semiconductor Corporation, Santa Clara, CA (US)

( * ) Notice: Subject to any disclaimer, the term of this patent is extended or adjusted under 35 U.S.C. 154(b) by 101 days.

(21) Appl. No.: 10/093,767

(22) Filed: Mar. 7, 2002

(65) Prior Publication Data

US 2003/0169070 A1 Sep. 11, 2003

(51) Int. Cl.[7] .............................. G06F 7/38; G01R 31/28
(52) U.S. Cl. .............................. 326/38; 326/16; 326/46; 714/726
(58) Field of Search .............................. 326/38, 40, 39, 326/41, 46, 16; 714/726, 727

(56) References Cited

U.S. PATENT DOCUMENTS

| 5,680,543 | A | | 10/1997 | Bhawmik |
| 5,869,979 | A | * | 2/1999 | Bocchino ..................... 326/38 |
| 6,115,827 | A | | 9/2000 | Nadeau-Dostie et al. |
| 6,223,313 | B1 | | 4/2001 | How et al. .................. 714/724 |
| 6,304,099 | B1 | * | 10/2001 | Tang et al. .................... 326/38 |
| 6,327,684 | B1 | | 12/2001 | Nadeau-Dostie et al. |
| 6,356,107 | B1 | * | 3/2002 | Tang et al. .................... 326/40 |

FOREIGN PATENT DOCUMENTS

WO     WO 01/33237     5/2001

OTHER PUBLICATIONS

Vermeulen B et al. "Test and dabug strategy of the PNX8525 Naxperiadigital video platform system chip" Proceedings International Test Conference 2001, ITC 2001.Baltimore, MD. Oct. 30–Nov. 1, 2001, International Test Conference, New York, NY: IEEE, US, Oct. 30, 2001, pp 121–130, XP002237599 ISBN: 0–7803–7169–0 paragraph '00041.

* cited by examiner

*Primary Examiner*—Daniel D. Chang
(74) *Attorney, Agent, or Firm*—Haynes, Beffel & Wolfeld LLP

(57) ABSTRACT

A system for remotely/automatedly testing an ASIC and particularly to testing a user-designed circuit is disclosed. In general, a system in accordance with the invention includes a plurality of cells, where the cells are couplable to form a user-designed circuit, e.g., by customizing routing. Within the ASIC and prior to any knowledge of the user-designed circuit, the ASIC includes circuitry to enable internal remote/automated testing of the user-designed circuit to be later formed. The circuitry controls the input and mode of operation of the cells and the sequencing of multiple synchronous or asynchronous clock domain inputs thereby providing testing of the user-designed circuit at speed for stuck-at-faults and delay faults.

37 Claims, 10 Drawing Sheets

METHOD AND APPARATUS FOR BUILT-IN SELF-TEST OF LOGIC CIRCUITS WITH MULTIPLE CLOCK DOMAINS

FIELD OF INVENTION

The invention generally relates to application specific integrated circuits (ASICs), and more specifically, the invention relates to testing user-designed circuits.

BACKGROUND OF THE INVENTION

Use of ASICs has become widespread in the semiconductor industry as giving circuit design engineers a relatively high amount of circuit functionality in a relatively small package. In particular, ASICs are customizable integrated circuits that are customized to implement a circuit specified by a design engineer (a "user-designed circuit"). An example of an ASIC is a gate array or standard cell, which generally include a plurality of function blocks, each of which are predesigned and/or prefabricated to include a particular number, arrangement, and type of semiconductor devices, e.g., transistors. To customize an ASIC to implement a particular user-designed circuit specified by a design engineer, various connections are made among the semiconductor devices within the function block and/or various connections are made among function blocks (i.e., routing is customized).

Once ASICs are customized to implement a user-designed circuit, they must be initially tested to ensure that the user-designed circuit operates properly. Additionally, testing of the user-designed circuit after production and after the circuit has been incorporated into an end product is often necessary to determine if the circuit still operates properly. Tests must be able to detect faults, which are the results of defects (physical problems with the circuit, e.g., shorts, and/or improper circuit design), resulting in improper or unexpected circuit behavior.

Faults include "Stuck At Faults" (SAFs) and delay faults. SAFs occur when a particular connection in the circuit remains at (is "stuck" at) a logical low level or a logical high level regardless of what signals are applied to the circuit. (As used herein, "logical low" refers to a "0" signal, which is often a ground signal.

A "logical high" refers to a "1" signal, which is often a $V_{DD}$ signal.) Delay faults occur when the circuit is designed to accommodate a particular propagation time, but the circuit actually operates much slower than expected. For instance, if a circuit was designed with the belief that there would only be a 5 ns propagation time of a signal between a first point and a second point, but in operation the signal actually takes 15 ns to propagate from the first point to the second point, the circuit may not operate properly.

Well-designed tests of an integrated circuit will generally be able to detect most SAFs at the gate level (i.e., the conceptual circuit design level containing Boolean logic, flip-flops, etc.) by testing all connections between logic elements. In order to test all connections between logic elements, the tester needs to be able to (1) access the integrated circuit, (2) control, or set, the value at a particular connection and (3) be able to observe the value at the particular connection. For instance, in order to test the connection between point A and point B for Stuck At 0 Faults, the tester needs to be able to apply stimulus data that ought to place a logical high on the connection line, and then the tester needs to be able to observe the connection to see if and how the value changes as a result of the stimulus data.

One method of testing an integrated circuit that enjoys the most popularity among IC designers is "scan" testing, which will be described with reference to the block diagrams of FIGS. 1 and 1A. In FIG. 1, circuit 102 is generally composed of any number and arrangement of logic elements (e.g., Boolean logic gates, flip-flops, latches, etc.) and has input A and output B. Inputs A can be coupled directly to flip-flops 104 (via lines 114) or to other logic elements in logic 102. Likewise, outputs from flip-flops 104 can be coupled directly to outputs B (via lines 112), to other logic elements in logic 102, or directly to other flip-flop 104 inputs. Each flip-flop 104 contained in circuit 102 is coupled to a clock signal such as CLK1 108 or CLK2 109. The flip-flops 104, shown apart from the circuit 102 for illustrative purposes only, will each, upon receiving a triggering clock edge, store a value and hold the value on its respective output until a next triggering clock edge is received. Therefore the flip-flops of circuit 102 collectively represent the state of the circuit: at any time when the clocks are stopped, the flip-flops will maintain the state of the circuit.

By taking advantage of the state-machine nature of the circuit, the state of the circuit 102 can be controlled for test purposes by placing known values into the flip-flops 104. Similarly, the state of the circuit can also be observed by reading the values held in the flip-flops after the circuit has been run. In order to control and observe the values held in flip-flops 104 of the circuit 102, the flip-flops 104 are, in addition to their regular circuit connections represented by lines 112 and 114, coupled to one another in a daisy-chain fashion, i.e., the output of one flip-flop is coupled to the input of the next flip-flop, as generally shown in FIG. 1A. Furthermore, clock steering logic, such as multiplexer 111, is frequently inserted so that all testing and shifting can be effected with one clock signal.

To test logic circuit 102, external Integrated Circuit test equipment ("external IC tester") must be manually connected to the circuit and controlled by a user. The external IC test equipment stops the regular "mission mode" operation of logic circuit 102 and shifts a series of stimulus values into flip-flops 104, via the daisy-chain, so that each flip-flop in logic circuit 102 has a known value. The external IC test equipment shifts the stimulus values into circuit 102 by applying the stimulus values one at a time to the input 106 of the first flip-flop in the daisy-chain and running the circuit clock 108 (coupled to the clock input of each flip-flop 104) to propagate the values through the daisy-chain. After the flip-flops 104 have each received a known test value, the external IC test equipment then exercises circuit 102 (runs normally) for a brief period, e.g., one clock cycle, and then stops circuit 102. The state of the circuit resulting from its being run is captured in flip-flops 104. The external IC test equipment then shifts the resulting values out of the flip-flops 104, by again running the clock 108 and reading the values at the output 110 of the last flip-flop in the daisy-chain.

More specifically, to implement scan-type testing, typically one of two techniques is used: mux-based scan or clock-based scan. "Mux-based scan" is the more commonly used technique and is described with reference to the block diagram of FIG. 2. Clock-based scan will be described with reference to FIG. 3.

As shown in FIG. 2, for each flip-flop $104_n$ in the logic circuit 102, (where flip-flops 104 are shown apart from circuit 102 for illustrative purposes only) a 2-input multiplexer $212_n$ is placed at the D-input of each respective flip-flop $104_n$. One input, e.g., the 0 input, for each multiplexer $212_n$ receives the regular connection 114 from the logic 102 that would otherwise go directly into the D-input but for the multiplexer $212_n$. The second input, e.g., the 1 input, of each multiplexer $212_n$ is coupled to the output of a flip-flop $104_{n+1}$, thereby daisy-chaining the flip-flops. As shown in FIG. 2, the Q-output of flip-flop $104_2$ is coupled to the 1-input of multiplexer $212_1$, and the Q-output of flip-flop $104_1$ would be coupled to another multiplexer $212_0$ (not shown). The 1-input to multiplexer $212_2$ would be received from the Q-output of flip-flop $104_3$ (not shown). A circuit clock line (CLK) 108 is coupled to each of the flip-flops $104_n$ as it would be without inclusion of multiplexers $212_n$. A SHIFT signal 214 is coupled to the select input of each of the multiplexers $212_n$. When SHIFT 214 is a logical low, the circuit operates normally, as if the multiplexers were not present. Such normal circuit operation can be used for regular mission mode operation as well as for exercising circuitry during test modes. When SHIFT is a logical high, the circuit is placed in a "shift mode" of operation and test data (stimulus or result values) is shifted into or out of flip-flops $104_n$ by application of a clock signal on CLK 108.

In FIG. 2, to test circuit 102, external IC test equipment is applied to control the SHIFT signal 214 and the signal on CLK 108. The external IC test equipment first places circuit 102 in shift mode by placing a logical high signal on SHIFT 214. The clock signal on CLK 108 is run in a controlled manner by the external IC test equipment to shift stimulus values into the flip-flops 104. Once stimulus values are in place, SHIFT 214 is brought to a logical low. The external IC test equipment then runs the clock signal on CLK 108 a limited number of clock cycles, e.g., one clock cycle. Resulting values are then captured in the flip-flops $104_n$ by operation of the last clock edge in this test sequence, also sometimes referred to as a "capture clock." SHIFT is then brought to a logical high, re-entering shift mode, and external IC test equipment applies a signal on CLK 108 to allow the captured data to be shifted out of the flip-flops $104_n$ into external IC test equipment to be analyzed.

While the above testing method is useful as described for detecting SAFs, mux-based scan can also be used to test for delay faults. To do so, test data would be shifted into the flip-flops $104_n$ as described above. Then external IC test equipment applies two clock edges—"a launch clock" and "a capture clock"—on CLK 108 with controlled timing between them. The "launch clock" is the clock edge that places the circuit in a state ready for test. In delay fault testing, the first clock edge that occurs after the stimulus data is finally positioned in flip-flops 104 is the launch clock, while in the SAF testing scenario described above, the launch clock would essentially be the last clock edge to occur in shift mode. The "capture clock" is the clock edge at which resulting values are captured in the flip-flops 104, and is similar in both delay fault and SAF testing. After the launch clock and the capture clock have been applied, external IC test equipment shifts resultant data out of the flip-flops $104_n$ as described above. If the captured data does not correspond to that expected, then a delay fault may be detected.

Typically, there are many "design-for-test" rules (DFT rules) that have become generally known and used in designing user-designed circuits as a direct consequence of mux-based scan in order to avoid problems during testing. These DFT rules include the following:

Circuits should preferably not be designed to include falling-edge triggered flip-flops. Otherwise, some flip-flops would be clocked on the rising edge of the circuit clock, and some would be clocked on the falling edge. In such a situation, during a test data shift in, some of the flip-flops may not receive appropriate stimulus values and to avoid this situation extra test flip-flops may need to be included in the daisy-chain.

Clocks should only be designed to be coupled to clock pins and not to the D-input of a flip-flop or a gate that ultimately is coupled to the D-input of a flip-flop. Otherwise, setup and hold time violations may occur during test mode and the circuit will not reliably capture response values.

The Q-output of a flip-flop should not be directly or indirectly (e.g., through combinational logic or drivers) coupled to the clock input of another flip-flop (such as in a Johnson counter), as that clock-input will not be adequately controllable during testing. More generally, clock inputs throughout the circuit must be controllable for testing the circuit.

All gates through which the clock passes must also be controlled during testing to allow the clock to pass uninfluenced by other values during test value shifting. For instance, if the clock signal is applied to the first input of a 2-input AND-gate, where the AND-gate output is applied to the clock input of a flip-flop, then the second input to the AND-gate must be held to a logical high during a test value shift.

All asynchronous clear and reset pins must be gated so they can be prevented from interfering with shift mode.

Other DFT rules are also commonly known. Many of these DFT rules are a direct result of the fact that testing, e.g., controlling and observing values using external IC test equipment, can only be done with static patterns (logical high and logical low values)—clock edge transitions can not be generated.

Thus, the DFT rules, which have often developed as a result of the limitations of mux-based scan, have placed considerable limits on the design of the circuit, all to simply allow user intervention and testing of the circuit.

A second type of scan technique is "clock-based scan", described with reference to the block diagram of FIG. 3. Rather than replacing each flip-flop in the logic circuit 102 with a mux/flip-flop combination as in mux-based scan, the flip-flops $104_n$ in the logic design 102 are replaced with a dual interface flip-flop 304 shown in FIG. 3. Flip-flop 304 is composed of one flip-flop having two interfaces: one interface is shown in lower portion 310 and one interface is shown in the upper portion 312 of flip-flop 304. When placed in a circuit 102, the inputs and outputs (D, Q, CLK) of lower interface 310 are coupled to receive signals used for normal operation (mission mode). The inputs and outputs (TD, TQ) of upper interface 312 are coupled with the upper interface of other flip-flops 304 to form a daisy-chain, and TCLK is coupled to receive a test clock signal from an external IC test equipment, which can be distinct from the regular circuit clock (the "user clock") coupled to CLK.

A signal input to SHIFT 314 indicates whether the upper interface or the lower interface should be active. When the signal coupled to the SHIFT input 314 is a logical low, the upper interface 312 maybe inactive while the lower interface 310 must be active. Thus, when the signal on SHIFT 314 is low, the circuit 102 behaves in mission mode. When the signal on SHIFT 314 is a logical high, the lower interface 310 must be inactive and the upper interface 312 must be active. Stimulus values are shifted into the respective flip-flops 304 via the daisy chained upper-interfaces 312, using external IC test equipment which controls the shift mode using TCLK. Once stimulus values are in place, the external IC test equipment will run the circuit in test mode for a controlled time period (i.e., SHIFT receives a logical low), after which SHIFT is again asserted high to enable captured values to be shifted out under control of TCLK. As will be understood by those of skill in the art, clock-based scan can easily mimic mux-based scan. As is also known in the art, device 304 maybe a latch having two interfaces (one for mission and test modes and one for shift mode) rather than a flip-flop.

Clock-based scan is advantageous over mux-based scan in that clock-based scan has fewer DFT rules associated with it. Since a separate interface and test clock are used for testing, most clock related DFT rules will no longer need to be followed when designing the underlying circuit. Nonetheless, clock-based scan tends to be more expensive than mux-based scan, causing it to be used less frequently than mux-based scan.

Thus, although external IC test equipment is widely used to test integrated circuits, these techniques are replete with limitations. For example, external IC test equipment must be physically attached to the circuit to perform testing. After the circuit has been completed and incorporated into a product, subsequent testing often becomes much more difficult. The circuit may be located in an area that is not easily accessible, such as on a satellite, in a hazardous materials area, etc.

In addition to requiring user involvement, existing testing techniques do not provide for at speed testing of circuits with multiple asynchronous clock domains.

Therefore, an ASIC design that inexpensively (in terms of real estate and other resources) implements remote and/or automated internal self-testing of a circuit implemented by the ASIC, permits testing of the circuit without the need for external equipment, allows at speed testing of the circuit subsequent to implementation into a product, or allows testing of a circuit with multiple asynchronous clock domains would represent an advancement in the art.

SUMMARY OF THE INVENTION

A system for remotely/automatedly testing an integrated circuit is disclosed. In general, a system in accordance with the invention includes an ASIC which may be configured as a user-designed circuit. Within the ASIC and prior to any knowledge of the user-designed circuit, the ASIC includes circuitry to enable internal remote/automated testing of the user-designed circuit to be later formed. The circuitry controls the input and mode of operation of the cells and thereby configures each cell to operate in a shift mode using clock-based scan, or to operate in normal mode. When selected to operate in a normal mode of operation, each of the cells forms part of the user-designed circuit, and may operate to perform a sequential logic function, a combinational logic function, a memory logic function, or other function. When selected to operate in shift mode, the cells operate together as a series of daisy-chained master-slave flip-flops, nonresponsive to user signals, regardless of the underlying function performed by each of the cells in its respective normal mode of operation, as dictated by the user-designed circuit.

To test a user-designed circuit, internal test circuitry first places each cell in a shift mode, thereby forming daisy-chained flip-flops. Pseudo-random data is shifted into the flip-flops via the daisy-chain. Once shifting has completed, the cells are returned to normal mode and each clock input is sequentially activated for a predetermined period. Once all clock inputs have been activated, the cells are again placed in shift mode and the captured data is shifted out of the circuit into an LFSR signature compactor. As the captured data is shifted out a new set of pseudo-random data may be simultaneously shifted into the circuit; and the process repeated. Such a method of testing the user-designed circuit is referred to herein as a testing sequence.

A testing sequence as described in accordance with an embodiment of the invention permits remote and/or automated testing of a user-designed circuit without user involvement. Moreover, circuitry to enable remote/automated testing in accordance with the invention is placed in the ASIC prior to any knowledge of the user-designed circuit, and therefore testing of the user-designed circuit does not depend on the user-designed circuit.

According to an aspect, the invention comprises an integrated circuit that includes a plurality of cells configured to form a user-designed circuit. The integrated circuit maybe controlled during a testing sequence using a clock control circuit. Additionally, a general control circuit may also be included which controls the mode of operation of the ASIC.

According to yet another aspect, the invention comprises an integrated circuit including a plurality of cells configured to form a user-designed circuit. The integrated circuit may include a plurality of clock domain inputs that are received through a plurality of clock input pads, wherein a clock input pad receives a first clock input and a second clock input pad receives a second clock input. For testing, a plurality of clock control circuits may be included in the ASIC, wherein a first clock control circuit is in communication with the first clock input pad and a second clock control circuit is in communication with the second clock input pad.

In still another aspect, a method for testing an integrated circuit that includes a plurality of cells configured to form a user-designed circuit having a plurality of clock inputs is provided. The plurality of cells are selectable to operate in a normal mode of operation and a shift mode of operation, wherein when selected to operate in a shift mode of operation the cells behave as a plurality of daisy-chained flip-flops, each flip-flop having a master latch and a slave latch. The method comprises the steps of placing the cells in the shift mode of operation, shifting pseudo-random data into the plurality of cells via the plurality of daisy-chained flip-flops while the cells are in the shift mode of operation, placing the cells in the normal mode of operation, sequentially activating each of the plurality of clock inputs thereby sequentially exercising portions of the cells, again placing the plurality of cells in shift mode thereby capturing resulting data, and shifting the resulting data out of the circuit via the plurality of daisy-chained flip-flops.

DESCRIPTION OF THE DRAWINGS

The invention will be described with respect to particular embodiments thereof, and reference will be made to the drawings, which are not necessarily drawn to scale, and in which.

DETAILED DESCRIPTION

Figure 4:
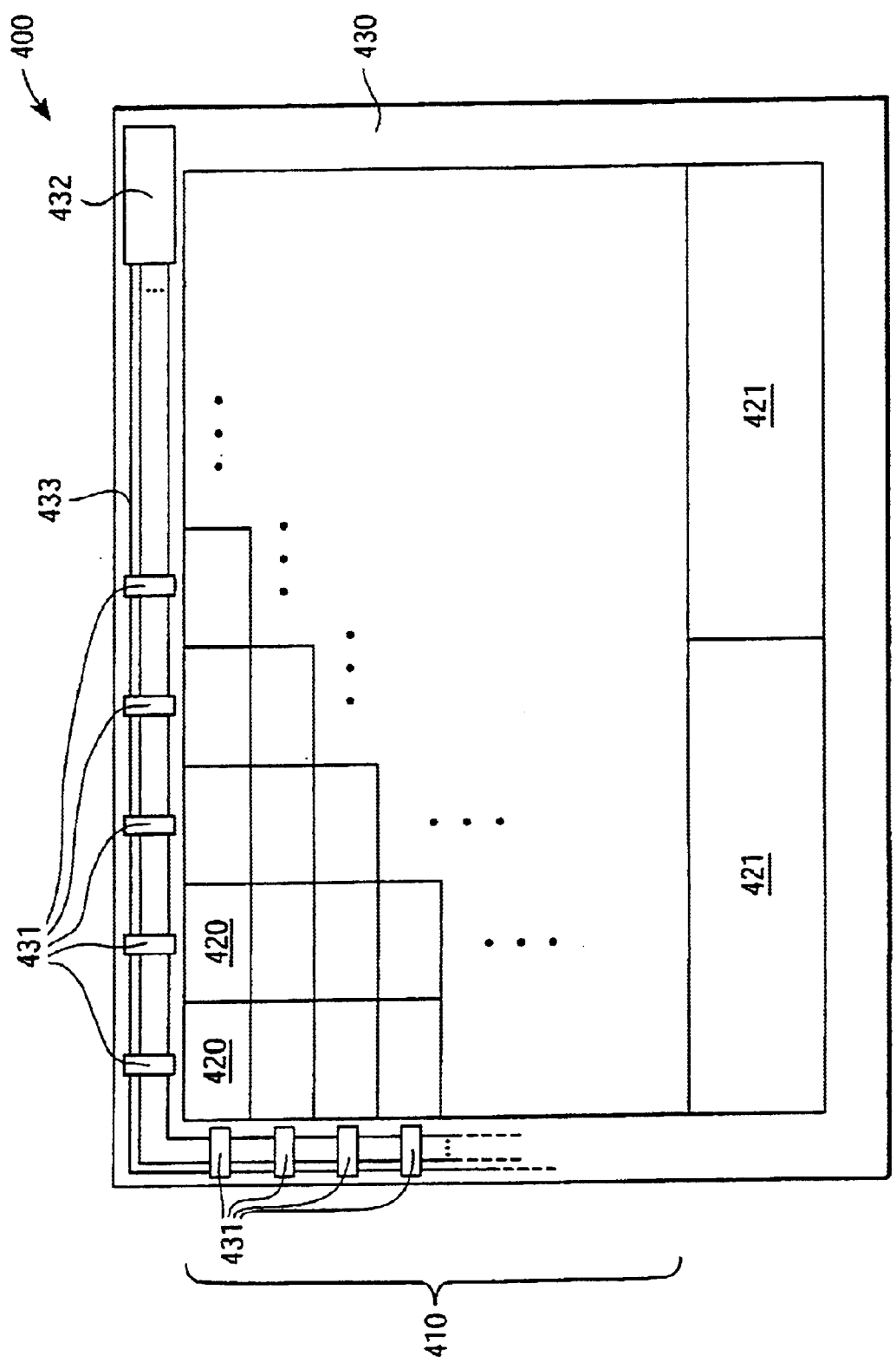
FIG. 4 is a generalized block diagram of an ASIC in accordance with one embodiment of the invention.

A generalized block diagram of an ASIC 400 in accordance with the invention is shown in FIG. 4. ASIC 400 includes an array 410 of function blocks (also referred to herein as cells) 420. In one embodiment of the invention, each cell 420 is identical to the other cells in array 410, although other embodiments of the invention allow for variance among cells. For example, as described below with respect to FIGS. 10 and 11, the cells may vary in size.

The cells may be configured to utilize scan testing, as described above, as described in co-pending U.S. patent application Ser. No. 09/488,667 entitled "TEST CIRCUITRY FOR ASICs" inventors Dana How, Adi Srinivasan, Robert Osann, Shridhar Mukund, and Eric West, filed Jan. 20, 2000; and U.S. patent application Ser. No. 10/056,686 (now U.S. Pat. No. 6,611,932) entitled "METHOD AND APPARATUS FOR CONTROLLING AND OBSERVING DATA IN A FUNCTION BLOCK-BASED ASIC," inventors Dana How, Adi Srinivasan, Robert Osann, and Shridhar Mukund, filed Jan. 24, 2002, each of which are commonly assigned to the assignee of the interest and herein incorporated by reference, or any other type of configuration which allows the cells to operate as a scan chain. Some embodiments of ASIC 400 may also include one or more regions 421, which contain circuitry such as memory blocks or logic cores. As described in the above referenced applications, each cell 420 is selectable for a normal mode of operation (performing combinational logic or sequential logic) or for a shift mode of operation (operating as a series of daisy-chained flip-flops).

Also shown in FIG. 4 is periphery area 430 surrounding cells 420, which generally includes circuitry used to access and utilize cells 420. In particular, such circuitry includes Test Access Port controller ("TAP controller") 432 which may include a JTAG interface, which is well known in the art. Additionally, periphery area 430 includes input/output pads ("I/O pads") 431, which interface with cells 420 to provide inputs and outputs. I/O pads 431 may be configured, according to user design, to act as clock inputs, data inputs, data outputs, etc. Periphery circuitry lines 433 also extend around the periphery area 430. Lines 433 interface the I/O pads 431 with TAP controller 432 and internal test circuitry. Also included in periphery area 430 is internal test circuitry. The internal test circuitry of an ASIC in accordance with embodiments of the invention as described herein, allows internal remote/automatic testing of a user-designed circuit without the need of external IC test equipment, or user involvement.

Figure 7:
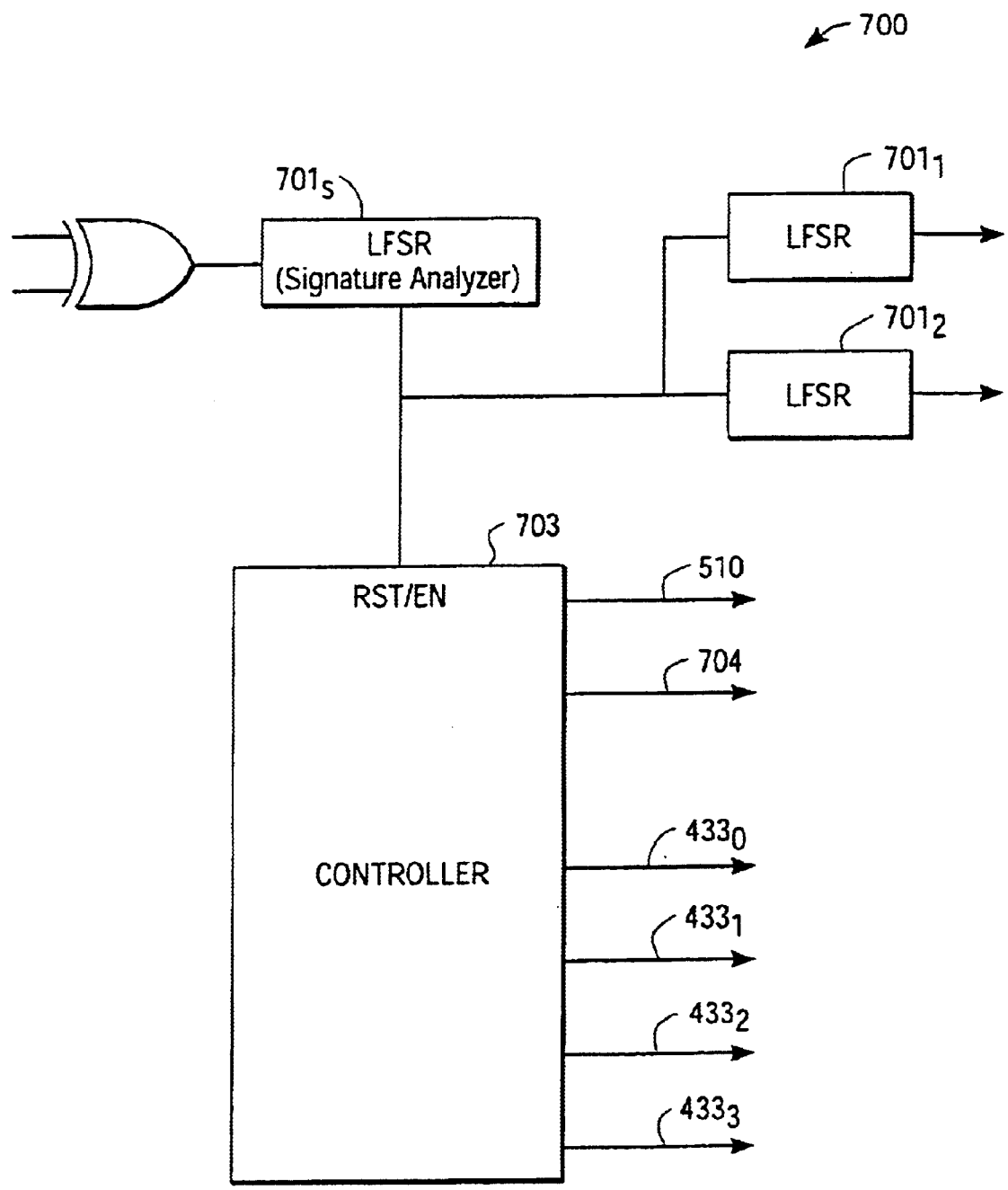
FIG. 7 is a functional diagram of an embodiment of general control circuitry.

In an embodiment of the invention, internal test circuitry allows remote and/or automated testing at speed of a user-designed circuit which may have multiple synchronous or asynchronous clock domains for all Stuck At Faults, and delay faults. The internal test circuitry includes clock control circuitry 500 (FIG. 5B) and general control circuitry 700 (FIG.7). Specifically, in an embodiment, clock control circuitry 500 is included in each clock input pad 5100 as illustrated in FIG. 5B, to control clock input duration, and general control circuitry 700 is included in TAP controller 432 for controlling the input and output of test data, clock domains, test clock inputs, and the integrated circuits's mode of operation.

Figure 5A:
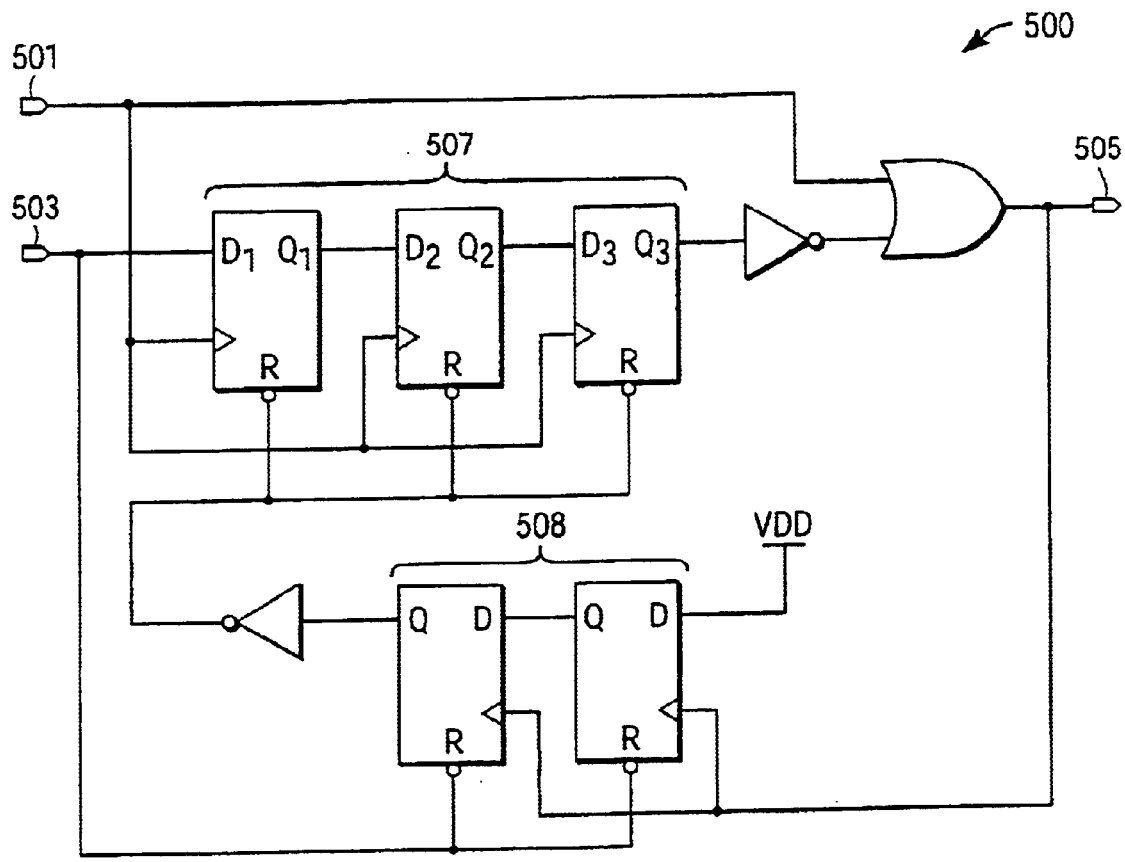
FIG. 5A is a functional block diagram of an embodiment of clock control circuitry.

FIG. 5A illustrates an embodiment of clock control circuitry 500 which interfaces with a clock domain to control clock input during a testing sequence. Clock control circuitry 500 includes an external clock pin 501, an enable pin 503, and a core clock pin 505. External clock pin 501 receives an external clock input specified according to a user design. Enable pin 503 receives an enable command, or logic high, from general control circuitry via one of the periphery lines 433.

Figure 5B:
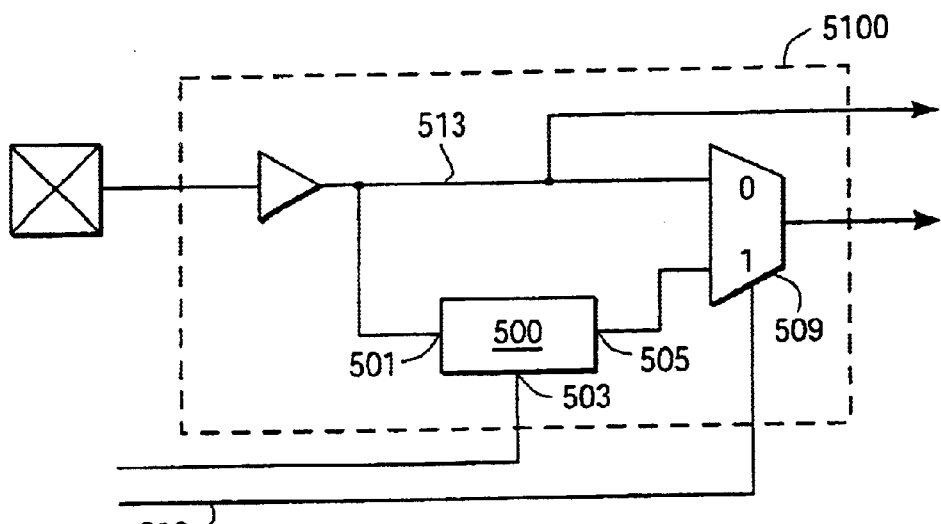
FIG. 5B is a block diagram of a clock input buffer, according to an embodiment of the invention.

As illustrated in FIG. 5B, core clock pin 505 is connected to multiplexer 509, which is controlled by general control circuitry 700 via input select line 510. Multiplexer 509 upon receipt of a logic high from general control circuitry 700 provides input generated by clock control circuitry 500 to the user-designed circuit. Similarly, when general control circuitry 700 provides a logic low signal to multiplexer 509 via input select line 510, multiplexer 509 allows the external clock signal to be input into the user-designed circuit.

Flip-flops 508 control the clock pulses that are provided as input to the ASIC from clock control circuitry 500. In the embodiment illustrated in FIG. 5, when enabled, clock control circuitry 500 provides two clock edges and then shuts off until it is reactivated. Providing two clock edges supplies two falling edges and two rising edges for each series of clock control circuitry 500 operation. This allows clock control circuitry 500 to be used for either positive or negative edge clock domains, as are known in the art, and performs testing of the user-designed circuit at speed. In an embodiment, the time between the two falling edges and the time between the two rising edges is equal to the period of the external clock.

In an alternative embodiment, clock control circuitry 500 may be configured to provide only one clock edge to the circuit when enabled by including only one flip-flop in the series of flip-flops 508. Providing only one clock edge allows functional testing of the circuit for faults, such as stack-at-faults.

Alternatively, clock control circuitry 500 may be configured to provide any other combination (e.g. 3, 4, 5, etc.) of clock edges to a user-designed circuit by increasing or decreasing the number of flip-flops in 508.

To provide synchronization with an external clock signal, enable pin 503 is synchronized to the external clock input when clock control circuitry 500 is enabled. Synchronization of the enable pin 503 is performed using a series of flip-flops 507. In an embodiment, the series of flip-flops 507 includes three flip-flops to reduce the possibility of metastability, although it is understood that fewer flip-flops, such as two flip-flops, may also be utilized to synchronize clock timing. Alternatively, more flip-flops may be used in the series of flip-flops for synchronizing the enable pin 503 with the external clock signal.

Synchronizing the enable pin 503 with the external clock signal implies a timing relationship between the enable pin 503 and the external clock pin 501.

Figure 6:
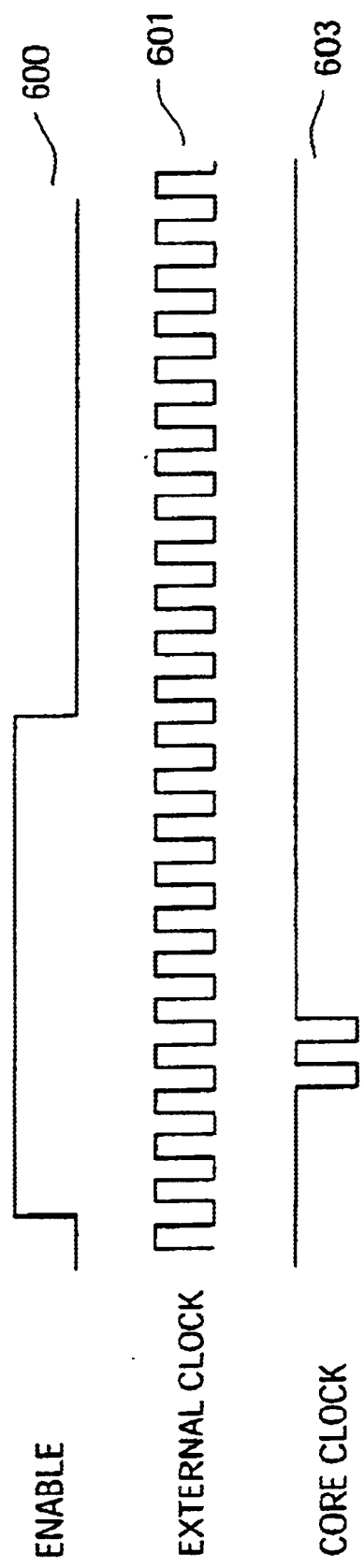
FIG. 6 is a timing diagram of an embodiment of the internal clock circuitry illustrated in FIG. 5.

FIG. 6 shows a timing diagram for an embodiment of the clock control circuitry 500 illustrated in FIGS. 5A and 5B. As can be seen from FIG. 6, the enable input 600 is held active for a specified amount of time, e.g. five external clock periods, as illustrated by square wave 601, plus an additional amount of time to reset the synchronizing flip-flops 507. The resulting clock signal input into cells 420 is equivalent to two pulses of the core clock 603.

In an embodiment, if a Phase Lock Loop ("PLL") device is included in a user-designed circuit for dividing or multiplying a clock input, clock control circuitry 500 may also be included on each of the outputs of the PLL. For example, if a PLL were receiving a particular clock input and producing four outputs, each output 90 degrees out of phase with one another, clock control circuitry 500 would be included on each of the four outputs, each external clock pin 501 would receive a respective clock output from the PLL. The enable pin of each of the four clock control circuits 500 would be tied together and connected to a periphery circuitry line 433, thereby allowing activation of each PLL clock output by the general control circuitry, as described below.

FIG. 7 illustrates an embodiment of general control circuitry 700. General control circuitry includes Linear Feedback Shift to Registers $701_i$ ("LFSR"), running from an independent test clock, for providing pseudo-random data to the scan chains for testing the circuit and for analyzing resultant test data, and a controller 703 for selecting the circuits mode of operation, for controlling clock input, and for sequencing the test operation. In an embodiment, general control circuitry 700 is included in the TAP controller 432 (FIG. 4). Alternatively, all or part of general control circuitry maybe included in other regions of the ASIC. Additionally, there may be any number or combination of LFSRs $701_i$ for increasing the speed with which data can be read into the circuit.

In an embodiment, the LFSR design may be selected based on the length of the scan chain. For example, if there are 100,000 flip-flops in a scan chain, to determine the total number of test cycles, the number of cycles to fill the core (length of the scan chain) is multiplied by the number of test frames. The number of test frames is how many times the core is filled and evaluated with a single user-clock or multiple user clocks per clock domain. If we assume 500 test frames for the above example, the total number of cycles would be 50,000,000.

The period of the LFSR may be calculated by computing $2^m-1>$ the number of flip-flops in the scan chain, where m is the length of the LFSR. In this example, solving for m in $2^m-1>100,000$ by computing int $(\log_2(100,000))+1$, the length of the LFSR is obtained. In the above example, the length is 17 bits.

To further increase randomization of test data, the length of the LFSR may be designed to be relatively prime with respect to the number of clock cycles required to fill the core, and relatively prime with respect to the length of each scan chain. Additionally, the period of the LFSR may be configured to be greater than the length of the scan chain. This will ensure detection of all single and double bit errors. Thus, for the above example, since 17 is relatively prime with respect to 100,000, an LFSR length of 17 will suffice.

Controller 703 controls the output of each clock input pad 5100, line 510 and the operation of each clock control circuit 500 included in clock input pads via periphery lines $433_i$. As described above, each periphery line $433_i$ is connected to an enable pin 503 of a respective clock control circuit 500. Sequentially asserting a logic high on a periphery line $433_i$ results in sequential activation of each clock control circuit 500 connected to a respective line $433_i$. In an embodiment, by sequentially activating each clock control circuit 500, each clock domain is clocked a set number of times (e.g.: 1, 2, 3, etc.) in isolation. This eliminates any intermediate behavior caused by clock domain crossings which have unknown timing. Additionally, since each domain is clocked twice or more at the actual clock rate, delay paths between cells are also tested. As discussed above, clock control circuits 500 may be configured to provide fewer or additional clock pulses to the user-designed circuit.

In addition to controlling clock input pads 5100 and clock control circuitry 500 controller 703 also controls the mode of operation of each cell in the user-designed circuit, and the shifting of pseudo-random data into and out of the flip-flops during a testing sequence.

Figure 8:
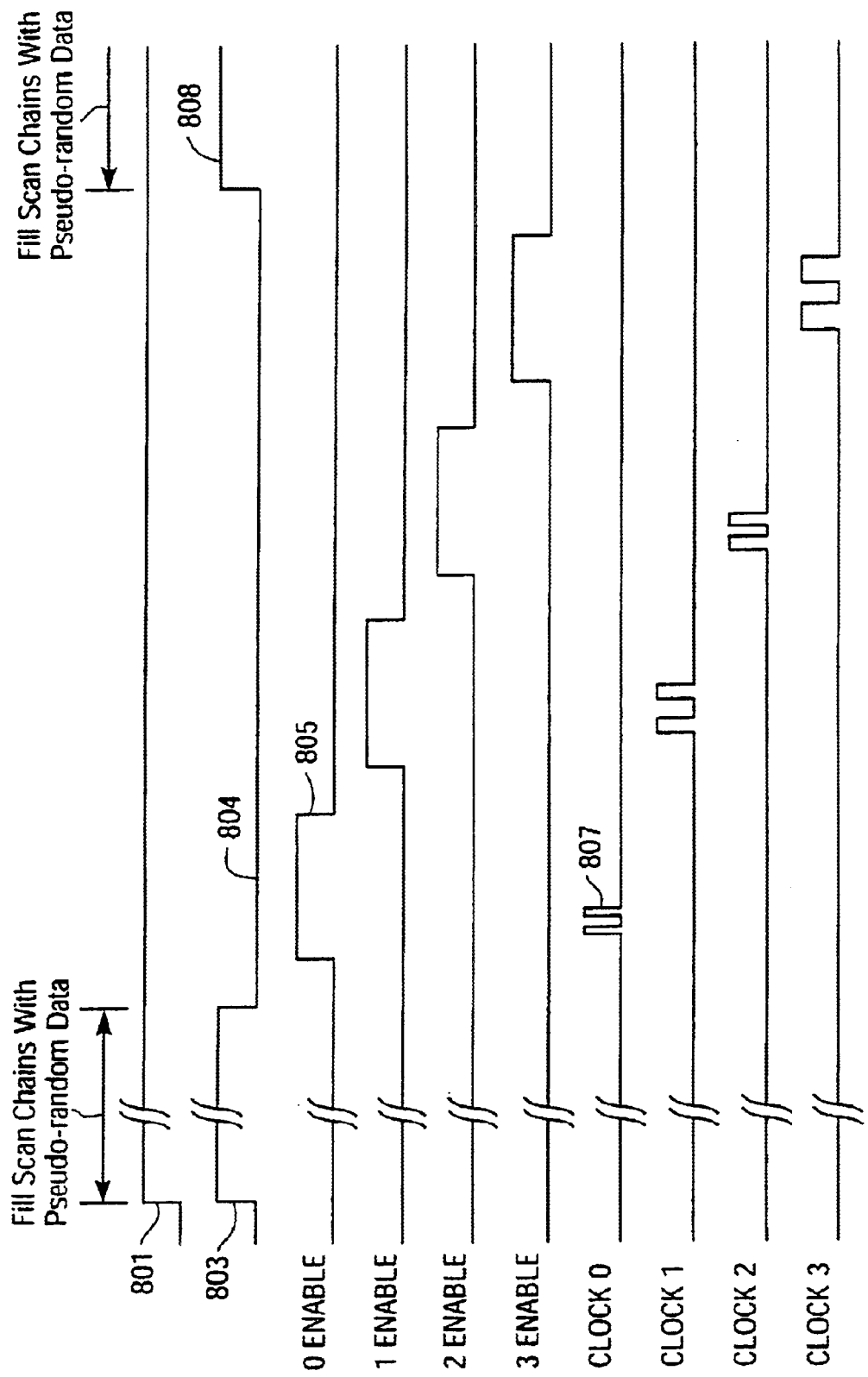
FIG. 8 is a timing diagram of an embodiment of a interval test circuitry operating in a testing sequence.

FIG. 8. Shows a timing diagram for an embodiment of internal test circuitry for controlling four (4) clock domains. During a testing sequence, controller 703 places a logic high 801 on input select line 510 thereby altering the output of the clock input pads to output signals from clock control circuitry 500. A logic high 803 is also placed on mode select line 704 thereby placing the cells in shift mode, generating a series of daisy-chained flip-flops. Once the scan chains are loaded with pseudo-random data, a logic low 804 is placed on mode select line 510 thereby returning each cell to its normal mode of operation.

Controller 703 then places a logic high 805 on periphery line $433_0$, which is in communication with one of the clock input pads clock control circuit 500. In response, the enabled clock control circuit outputs clock pulses 807. Controller 703 continues sequentially to assert a logic high signal on each periphery line thereby pulsing each clock domain input in isolation. Once each clock domain has been pulsed, the cells are again placed in shift mode, by again asserting a logic high on mode select line 510 and the resulting data is shifted out, new pseudo-random data is shifted in, and the process is repeated.

To ensure accurate testing, a few design for test rules must be followed by an IC designer. First, circuitry should be random-pattern testable. This means that three-state buffers should be avoided, or if they are used they should be decoded so that one and only one buffer is enabled at all times. Second, there should not be any "scannable" cells in the clock paths. Third, the reset or preset lines on flip-flops should also not be scannable. Fourth, there should not be any asynchronous loops in the logic circuit being tested. This rule is necessary to prevent non-deterministic signatures. Fifth, there should not be any multi-cycle paths in the logic circuit. Multi-cycle paths are not deterministic because often on a fast process corner a multi-cycle path may be less than one clock cycle long, but on a slow process corner, the same path may require more than one clock cycle.

Utilizing internal test circuitry as described and illustrated with respect to FIGS. 5A–8 provides the ability to include remote and/or automated testing of any user-designed circuit without prior knowledge of the user-designed circuit. The user-designed circuit may include multiple clock domains, synchronous or asynchronous.

Mode Control

Figure 1:
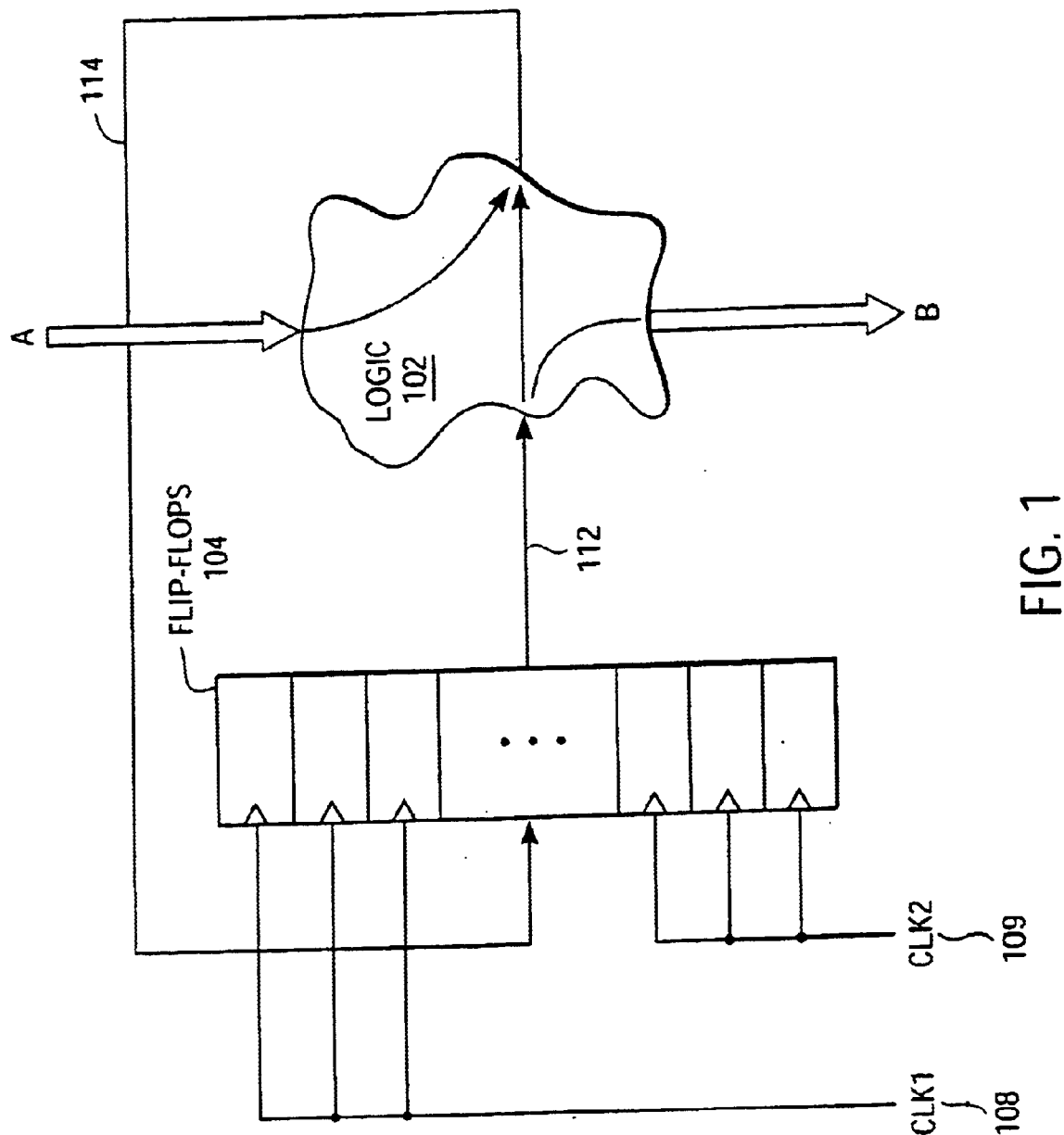
FIG. 1 is a generalized functional block diagram of a circuit including a plurality of flip-flops.
Figure 1A:
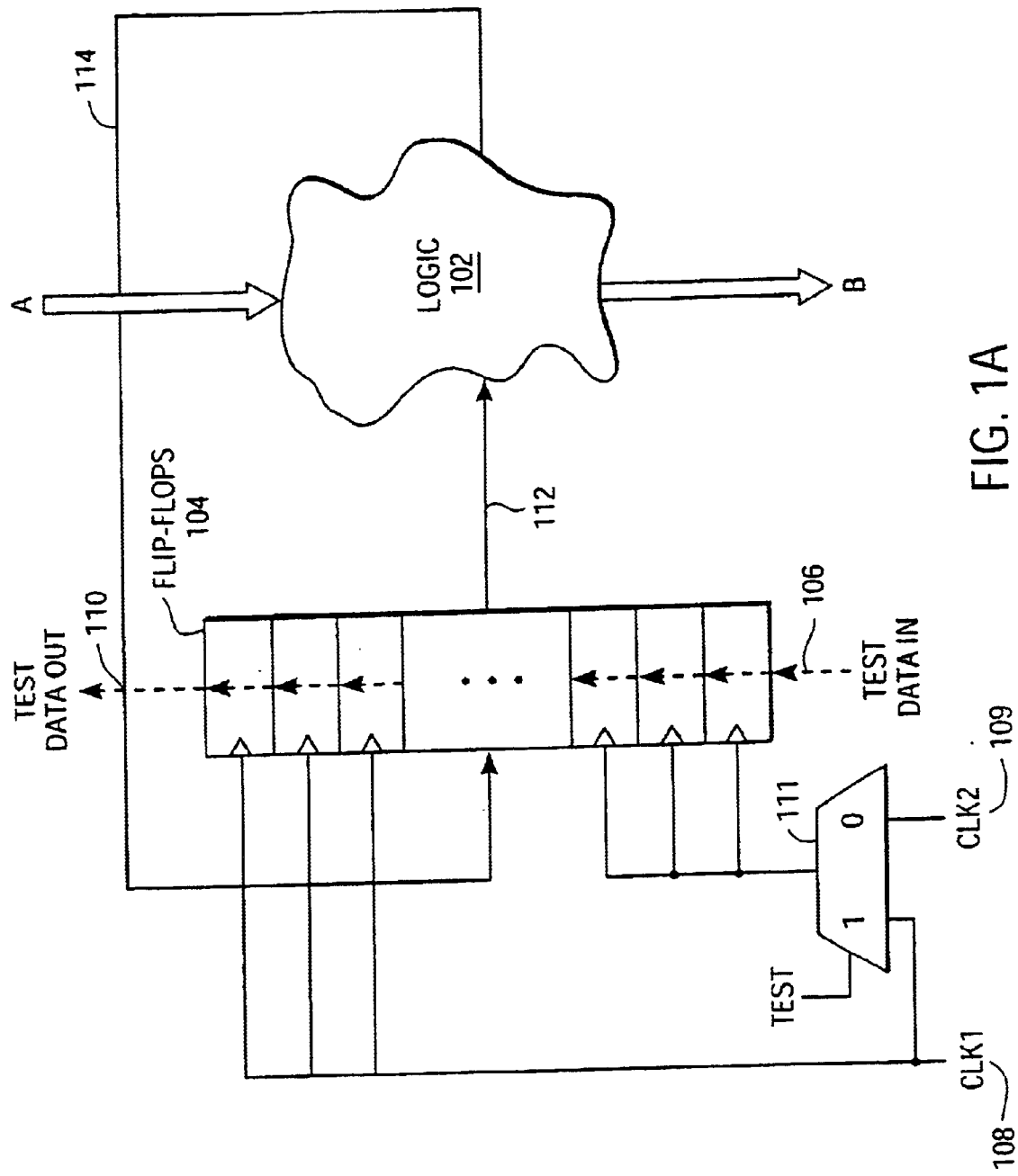
FIG. 1A shows the diagram of FIG. 1 and generally illustrates scan techniques.
Figure 3:
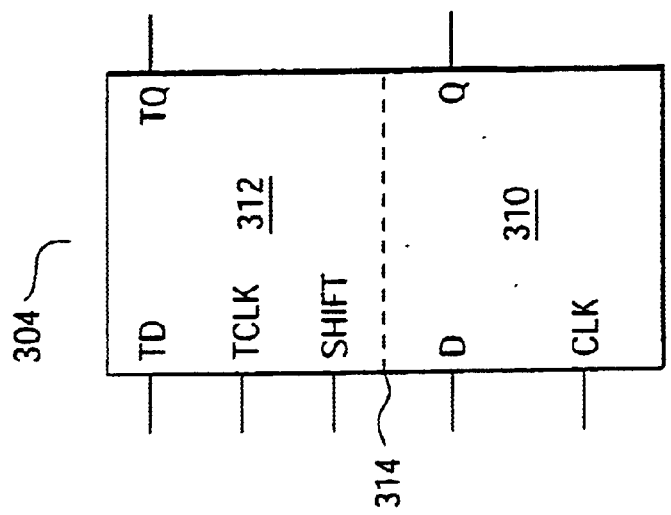
FIG. 3 is a functional block diagram of a device used in clock-based scan.
Figure 2:
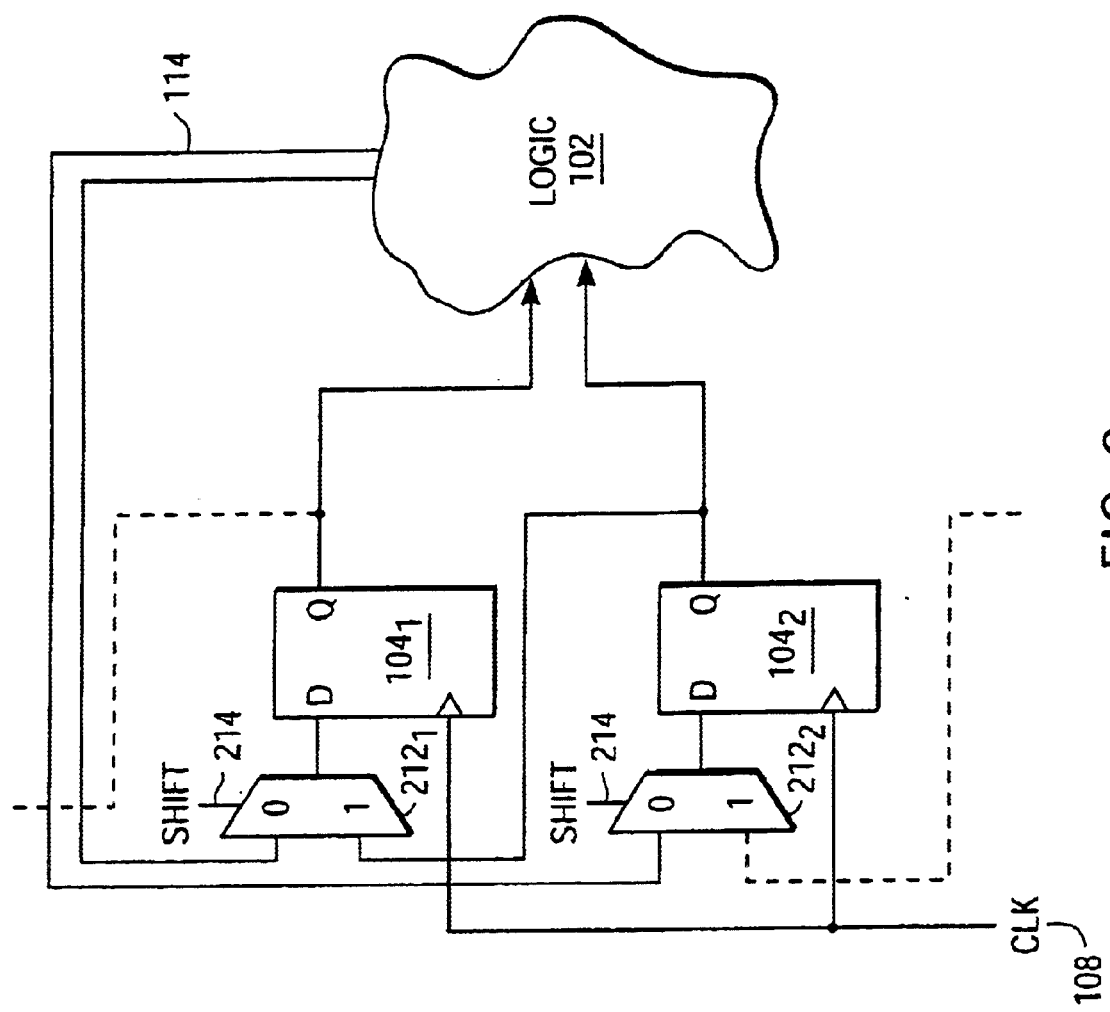
FIG. 2 is a more detailed representation of FIG. 1 when mux-based scan is utilized.
Figure 9:
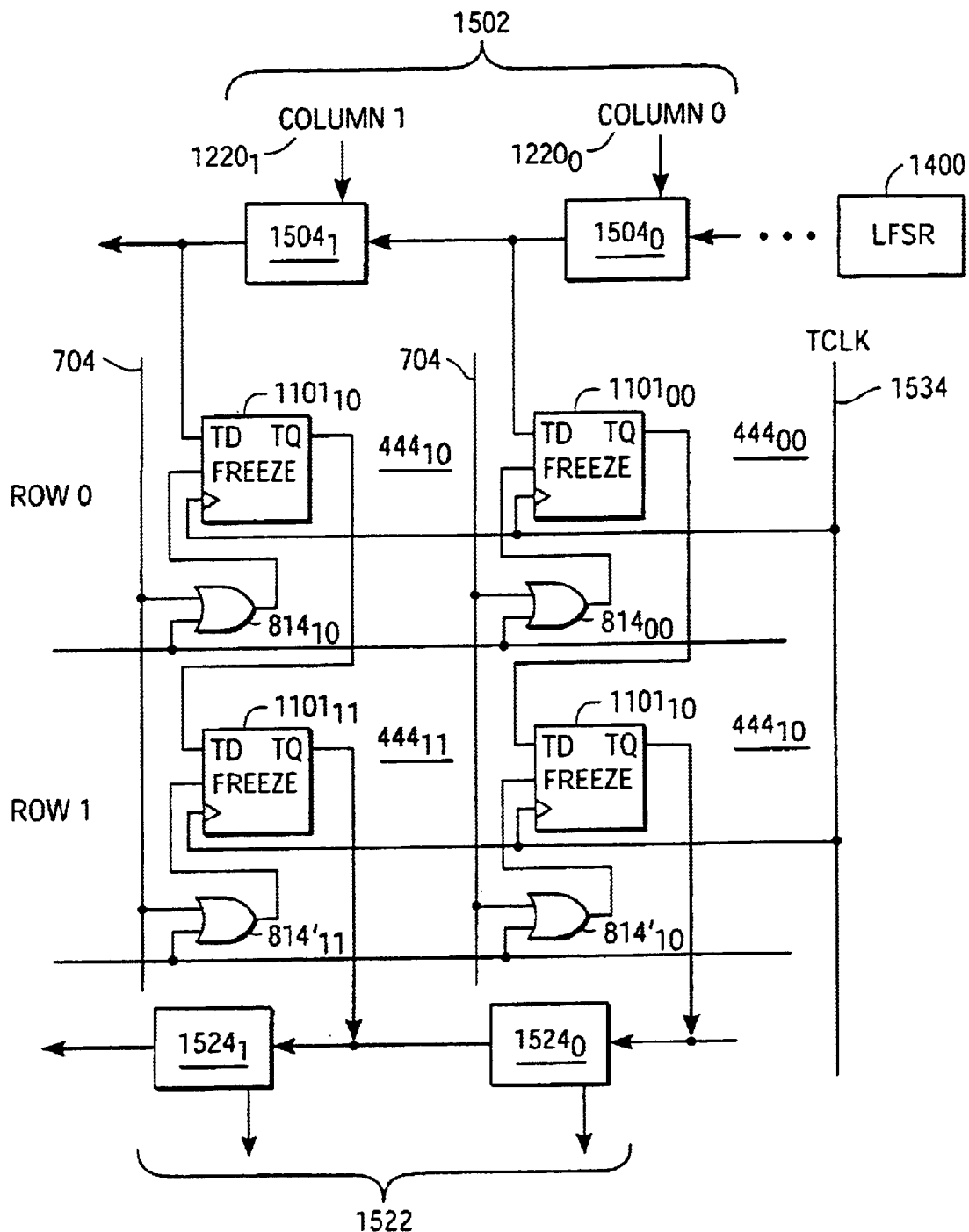
FIG. 9 is a functional block diagram of a scan-chain in accordance with an embodiment of the invention.

FIG. 9 shows a portion of an ASIC 1210 formed by the cells $444_{ij}$ of ASIC 400 illustrating the cells 420 as flip-flops (i.e., if referring to FIG. 3, the upper interface 312 for each cell is illustrated), according to an embodiment of the present invention. FIG. 9 includes OR gate 814' having one input coupled to mode select line 704.

By placing a logical high on mode select line 704, each cell $444_{ij}$ will be placed in shift mode. When cells $444_{ij}$ are in shift mode, data provided by LFSR 1400 through the shift register 1502 can be shifted into the cells $444_{ij}$. By placing a logical low on mode select line 704, each cell will be placed in normal mode.

Testing Sequence

Utilizing internal test circuitry, a user-designed circuit may be remotely or automatedly tested by controlling the state of the circuit and loading pseudo-random values into the circuit. To do so, general control circuitry 700 places the cells into shift mode and the flip-flops are "daisy-chained" together. The Q output of flip-flop $\mathbf{1101_{10}}$ is coupled to the D input of flip-flop $\mathbf{1101_{11}}$ and the daisy-chain continues to the bottom of each column. Pseudo-random values are loaded into shift register 1502 from the LFSR 1400, where the output of each stage $\mathbf{1504}_i$ of the shift register 1502 is coupled to the TD input of the first flip-flop $\mathbf{1101}_{i0}$ in each column. Once each shift register stage has a loaded value, the pseudo random data is shifted into the first flip-flop $\mathbf{1101_{10}}$, $\mathbf{1101_{00}}$ of respective cell $\mathbf{440_{10}}$, $\mathbf{440_{00}}$ of each column. This is accomplished by general control circuitry 700 applying a clock pulse on test clock (TCLK) 1534 to shift, one at a time, the pseudo random data from shift register stages $\mathbf{1504}_i$ to the respective daisy-chains, where they are simultaneously shifted through each column $\mathbf{1220}_i$ via the daisy-chains.

Once each cell $\mathbf{444}_{ij}$ has a pseudo-random value, each cell $\mathbf{444}_{ij}$ is returned to a normal mode of operation by placing a logical low value on mode select line 704. General control circuitry 700 then sequentially activates the enable pin 503 on each clock control circuit 500 by sequentially asserting a logic high on each of the periphery lines 433, as described above. In response to a logic high signal on enable pin, each clock control circuit provides a predetermined number of clock pulses (e.g., 2, 3, etc.) to the circuit to allow the respective circuit to perform in normal mode. Sequentially, activating each clock input allows at speed testing of circuits that have asynchronous clock domains.

Once each clock input has been activated, general control circuitry 700 again places the cells in shift mode by setting the mode select line 704 to a logical high and the resulting data is shifted out, again by applying TCLK 1534. The resulting values are shifted into shift register 1522, in one embodiment of the invention, from which the values are shifted out of the register into LFSR signature analyze $\mathbf{701}_3$ (FIG. 7) and XORed with an expected signature value. The resultant value may then be read out of the IC and observed.

As the resulting values are being shifted out of the cells, a new set of pseudo-random test values may be simultaneously shifted in and the sequence repeated. This process may be repeated several times, thereby increasing fault testing coverage.

In an embodiment, the testing sequence may be configured to run automatically upon the occurrence of a specific event (such as circuit start-up, shut-down, etc.), at a specific time (such as daily, weekly, etc.), or remotely activated by a user.

In an embodiment, during testing the output of the user-designed circuit is maintained at its previous state. Maintaining the previous state of output of the circuit reduces the possibility of generating errors in other devices which may be receiving circuit output.

Conversion to Standard Cells

Because of their ease of use and rapid production time, an array of cells and internal test circuitry as described above may be used by circuit designers in designing prototypes. Once a design has been finalized, however, a user may wish to optimize the circuit implemented by the array. Included in such optimization, a user may specify which I/O pads will be used as clock inputs and clock control circuitry 500 is thereby included in only those I/O pads. Additionally, such optimization of the cells may take place using a "standard cell" or a "partial standard cell," as described in co-pending application Ser. No. 09/488,667 entitled "TEST CIRCUITRY FOR ASICs" filed Jan. 20, 2000, incorporated by reference above.

Figure 10:
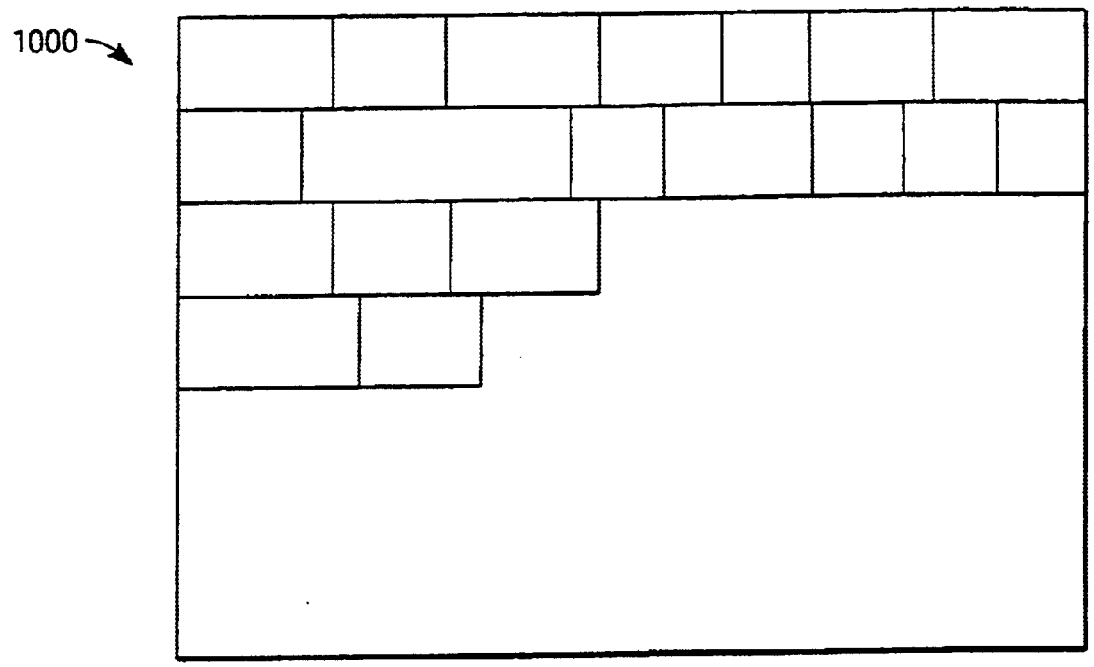
FIG. 10 is a generalized block diagram of a standard cell in accordance with an embodiment of the invention.

The term "standard cell" generally refers to ASICs having a higher degree of customizability than a gate array, even if such ASIC is not completely customizable. For instance, transistor size and placement within the cells may be altered and/or unused transistors may be eliminated. Routing may also be optimized for the particular application. As shown in FIG. 10, such optimization often results in cells that vary in size in the horizontal direction, although row height may remain the same.

Although the cell array is testable using the system and method described above, once converted to a standard cell the design still needs to be testable. Yet, once optimized, the regular columns of the previous array structure are eliminated, making addressable mode control with row and column lines previously described difficult to implement because of lack of a regular array.

Still, a system is provided, in accordance with an embodiment of the invention, for allowing the testability features described above to be translated to more customizable structures, such as standard cells and partial standard cells. Rather than utilizing row and column lines, the testability of a circuit can be translated to a more customized implementation by "hardwiring" the circuit.

Figure 11:
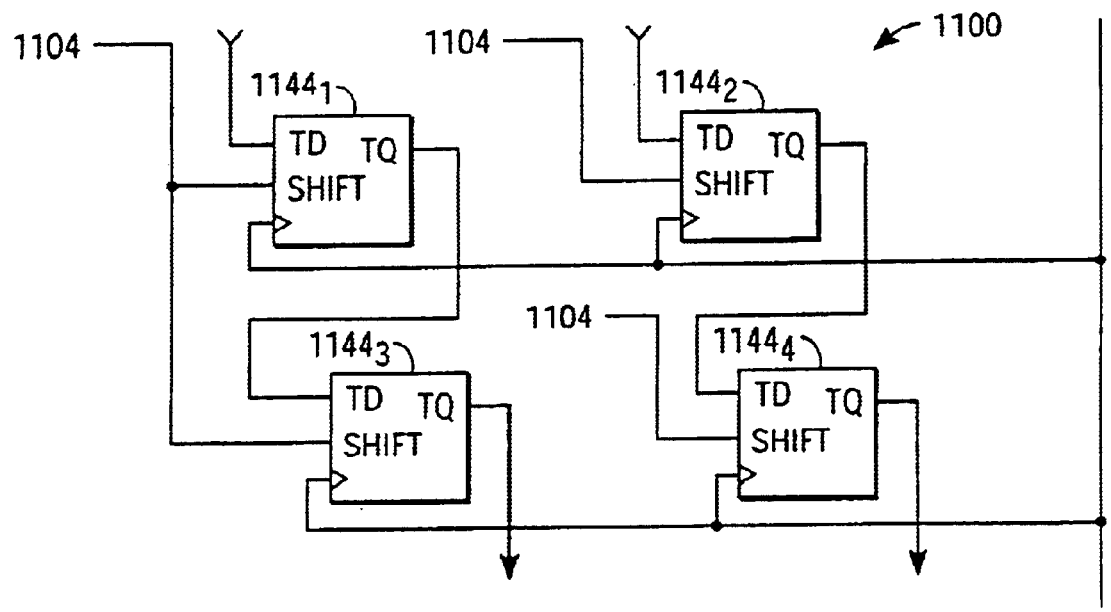
FIG. 11 illustrates a portion of a hardwired standard cell according to an embodiment of the invention.

More specifically, referring to FIG. 11, a portion 1100 of an overall circuit using cells $\mathbf{1144}_i$ is shown. Again, cells $\mathbf{1144}_i$ can implement combinational, sequential or other logic when operating in a normal mode, but will behave as flip-flops when placed in a test mode of operation. As described above, during a testing sequence each of the cells are daisy-chained together.

A mode select line 1104 is coupled directly to the "shift" input of each cell. As described above, the mode select line is controlled by general control circuitry 700. General control circuitry 700, by applying a logic high to the mode select line 1104, functions to daisy-chain the flip-flops together so pseudo-random data can be shifted into each cell, as described above.

Thus, a system and method has been described that allows internal remote/automated testability of virtually any ASIC, from arrays (sometimes called "module based" arrays) to standard cells, including those with multiple asynchronous clock domain inputs.

Although headings have been used in this description, they are to serve as a guide to the reader only and should not be construed to limit the invention.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. An integrated circuit comprising:
   a plurality of cells configured to form a user-designed circuit, wherein said user-designed circuit includes a plurality of clock domain inputs; and
   internal test circuitry including a plurality of clock control circuits, each clock control circuit in communication with a respective one of said plurality of clock domain inputs, the internal test circuitry further including a general control circuit in communication with each of said plurality of clock control circuits,
   wherein said general control circuit, in separately testing the user-designed circuit for each of the plurality of clock domain inputs, sequentially activates each of said clock control circuits, thereby sequentially providing a respective clock signal to said user-designed circuit from each of said clock control circuits.

2. The integrated circuit of claim 1, wherein each of said clock control circuits controls the duration of the respective clock signal carried on the respective clock domain input.

3. The integrated circuit of claim 1, wherein when said plurality of cells are configured to form a plurality of daisy-chained flip-flops, said internal test circuitry loads pseudo-random data into said plurality of daisy-chained flip-flops.

4. The integrated circuit of claim 1, wherein the internal test circuitry provides remote testing of the user-designed circuit.

5. The integrated circuit of claim 1, wherein the internal test circuitry provides automated testing of the user-designed circuit.

6. The integrated circuit of claim 1, wherein the internal test circuitry provides at-speed testing of the user-designed circuit for each of the plurality of clock domain inputs.

7. The integrated circuit of claim 1, wherein the internal test circuitry is included in the integrated circuit before the plurality of cells is configured to form a user-designed circuit.

8. The integrated circuit of claim 1, wherein the internal test circuitry separately and automatically tests the user-designed circuit for each of the plurality of clock domain inputs.

9. An integrated circuit according to claim 1, wherein at least two of said clock domain inputs are asynchronous relative to each other.

10. An integrated circuit comprising:
a plurality of cells configured to form a user-designed circuit; and,
a clock control circuit, wherein said clock control circuit comprises:
an external clock input in communication with an external clock;
a core clock output in communication with at least a portion of said plurality of cells, wherein said core clock output provides a clock input signal to said portion of said plurality of cells; and,
a synchronizer, wherein said synchronizer is configured to synchronize said clock input signal provided via said core clock output with said external clock input.

11. The integrated circuit of claim 10, wherein said synchronizer includes a plurality of flip-flops.

12. The integrated circuit of claim 10, wherein the user-designed circuit includes a plurality of clock domain inputs, and further includes
a respective clock control circuit for each clock domain input; and
a general control circuit, wherein the general controls the operation of each clock control circuit.

13. The integrated circuit of claim 12, wherein said clock domain inputs carry asynchronous dock signals.

14. The integrated circuit of 12, wherein said general control circuit comprises:
a Linear Feedback Shift Register ("LFSR").

15. The integrated circuit of claim 14, wherein said LFSR generates pseudo-random data that is serially loaded into said cells.

16. The integrated circuit of claim 12, wherein said general control circuit controls the mode of operation of said user-designed circuit.

17. An integrated circuit comprising:
a plurality of cells configured to form a user-designed circuit, wherein said user-designed circuit includes a plurality of clock domain inputs, including a first clock input and a second clock input;
a plurality of clock input pads wherein a first clock input pad receives the first clock input and a second clock input pad receives the second clock input; and
a plurality of clock control circuits,
wherein a first clock control circuit is in communication with and included in said first clock input pad and a second clock control circuit is in communication with and included in said second clock input pad,
wherein the first clock control circuit controls the duration of a clock signal carried on the first clock input,
and wherein the second clock control circuit controls the duration of a clock signal carried on the second clock input.

18. The integrated circuit of claim 17, further comprising:
a general control circuit in communication with said first clock input pad and said second clock input pad, wherein the general control circuit controls the operation of said first clock input pad and said second clock input pad.

19. The integrated circuit of claim 18, wherein said general control circuit is in communication with said plurality of cells and controls the operation of said plurality of cells.

20. A method for testing an integrated circuit comprising a plurality of cells configured to form a user-designed circuit having a plurality of clock domains each having a respective clock input, wherein said plurality of cells are selectable to operate in a normal mode of operation and a shift mode of operation, wherein when selected to operate in a shift mode of operation said cells behave as a plurality of daisy-chained flip-flops, each flip-flop having a master latch and a slave latch, said method comprising the steps of:
placing said plurality of cells in said shift mode of operation;
shifting pseudo-random data into said plurality of cells via said plurality of daisy-chained flip-flops while said cells are in said shift mode of operation;
placing said cells in said normal mode of operation;
sequentially activating each of said plurality of clock inputs;
again placing said plurality of cells in said shift mode of operation thereby capturing resulting data; and,
shifting said resulting data out of said plurality of cells via said plurality of daisy-chained flip-flops while said cells are in said shift mode of operation.

21. The method of claim 20, wherein said step of sequentially activating each of said clock inputs includes sequentially activating each of said clock inputs for a duration of time to allow at least two clock pulses.

22. The method of claim 20, wherein said plurality of clock inputs are asynchronous clock domain inputs.

23. An integrated circuit comprising:
a plurality of cells configured to form a user-designed circuit, wherein said user-designed circuit includes a plurality of clock domains; and,
built-in test circuitry,
wherein the built-in test circuitry separately tests the user-designed circuit for each of the plurality of clock domains, and includes:

a plurality of flip-flop sets, wherein each set includes at least one flip-flop, and wherein each set is in communication with one of a plurality of clock inputs, wherein each clock input carries a clock signal that defines a clock domain; and a general control circuit including a controller and a linear feedback shift resister (LFSR), wherein the general control circuit is in communication with the plurality of flip-flop sets.

24. The integrated circuit of claim 23, wherein the built-in test circuitry provides remote testing of the user-designed circuit.

25. The integrated circuit of claim 23, wherein the built-in test circuitry provides automated testing of the user-designed circuit.

26. The integrated circuit of claim 23, wherein the built-in test circuitry provides at-speed testing of the user-designed circuit for each of the plurality of clock domains.

27. The integrated circuit of claim 23, wherein the built-in test circuitry separately and automatically tests the user-designed circuit for each of the plurality of clock domains.

28. The integrated circuit of claim 23, wherein the built-in test circuitry is included in the integrated circuit before the plurality of cells is configured to form a user-designed circuit.

29. The integrated circuit of claim 23, where the built-in test circuitry includes a clock control circuit for each clock domain, the general control circuit being in communication with each clock control circuit, wherein the general control circuit controls operation of each clock control circuit.

30. The integrated circuit of claim 23, wherein at least some of the plurality of clock domains are asynchronous with respect to one another.

31. An integrated circuit comprising:

a plurality of storage elements, each having normal mode port and a shift mode port, the normal mode ports each having a data input, a data output and a normal mode clock input, and the shift mode ports each having a data input, a data output and a shift mode clock input;

normal mode clock signal lines connected to the normal mode clock input ports so as to distribute the normal mode clock input ports across a plurality of different clock domains; and internal test circuitry operable to, in sequence:
shift test data into the storage elements via the shift mode ports,
during the first test period, assert a predetermined number of first clock pulses to the normal mode clock inputs in a first one of the clock domains, the normal mode clock inputs in a second one of the clock domains receiving no clock pulses during the first test period,
during a second test period, and without any intervening shift of test data into or out of the storage elements via the shift mode ports, assert a predetermined number of second clock pulses to the normal mode clock inputs in the second clock domain, the normal mode clock inputs in the first clock domain receiving no clock pulses during the second test period, and
shift test data out from the storage elements via the shift mode ports.

32. A circuit according to claim 31, wherein the internal test circuitry, in shifting test data into the storage elements via the shift mode ports, asserts shift clock pulses in parallel to all of the shift mode clock inputs.

33. A circuit according to claim 31, a third one of the clock domains receives no clock pulses during either of the first and second test periods, and wherein during a third test period, after the second test period and without any intervening shift of test data into or out of the storage elements via the shift mode ports, the internal test circuitry is operable to assert a predetermined number of third clock pulses to the normal mode clock inputs in the third clock domain, the normal mode clock inputs in the first and second clock domains receiving no clock pulses during the third test period.

34. A circuit according to claim 31, wherein during the first test period, the normal mode clock inputs in only the first one clock domain receives any clock pulses.

35. A circuit according to claim 31, wherein the predetermined number of first clock pulses equals the predetermined number of second clock pulses.

36. A circuit according to claim 31, wherein the predetermined number of first clock pulses or the predetermined number of second clock pulses is at least two.

37. An integrated circuit comprising:

a plurality of cells configured to perform a user-designed function, the cells collectively including a plurality of scannable storage elements distributed across a plurality of different clock domains; and internal test circuitry operable to, sequentially:
shift test data into the scannable storage elements,
assert a respective predetermined number of clock pulses in each of the clock domains sequentially, without any intervening shift of test data into or out of the scannable storage elements, and
shift test data out from the scannable storage elements.

* * * * *